(12) United States Patent
Justel et al.

(10) Patent No.: US 7,753,553 B2
(45) Date of Patent: Jul. 13, 2010

(54) ILLUMINATION SYSTEM COMPRISING COLOR DEFICIENCY COMPENSATING LUMINESCENT MATERIAL

(75) Inventors: Thomas Justel, Witten (DE); Walter Mayr, Alsdorf (DE); Jorg Meyer, Aachen (DE); Peter Schmidt, Aachen (DE)

(73) Assignee: Koniklijke Philips Electronics N.V., Eindhoven (NL)

(*) Notice: Subject to any disclaimer, the term of this patent is extended or adjusted under 35 U.S.C. 154(b) by 144 days.

(21) Appl. No.: 11/916,100

(22) PCT Filed: May 22, 2006

(86) PCT No.: PCT/IB2006/051621

§ 371 (c)(1),
(2), (4) Date: Nov. 30, 2007

(87) PCT Pub. No.: WO2006/129228

PCT Pub. Date: Dec. 7, 2006

(65) Prior Publication Data

US 2008/0198573 A1  Aug. 21, 2008

(30) Foreign Application Priority Data

Jun. 2, 2005  (EP) .................................. 05104822

(51) Int. Cl.
*F21V 9/00* (2006.01)
(52) U.S. Cl. ............................ 362/231; 362/84; 257/98; 313/502
(58) Field of Classification Search .................... 362/84, 362/235; 313/502, 512, 506–507; 257/98–100
See application file for complete search history.

(56) References Cited

U.S. PATENT DOCUMENTS

| 3,748,517 | A | * | 7/1973 | Haft ............................ 313/487 |
| 4,075,532 | A | * | 2/1978 | Piper et al. ................... 313/487 |
| 5,998,925 | A | | 12/1999 | Shimizu et al. |
| 6,552,487 | B1 | * | 4/2003 | Ellens et al. ................. 313/503 |
| 6,680,569 | B2 | * | 1/2004 | Mueller-Mach et al. ..... 313/502 |
| 6,717,353 | B1 | * | 4/2004 | Mueller et al. .............. 313/501 |
| 2005/0006659 | A1 | * | 1/2005 | Ng et al. ........................ 257/99 |
| 2008/0198573 | A1 | * | 8/2008 | Justel et al. ................... 362/84 |

FOREIGN PATENT DOCUMENTS

| DE | 19962765 | 8/2000 |
| EP | 1095998 | 5/2001 |
| EP | 1339109 | 8/2003 |
| JP | 07-176794 | 7/1995 |

(Continued)

OTHER PUBLICATIONS

Shuji Nakamura et al: "High-Power InGaN Single-Quantum-Well-Structure Blue and Violet Light-Emitting Diodes", Appl. Phys. Lett., vol. 67, No. 13, pp. 1868-1870, 1995.

*Primary Examiner*—Ali Alavi

(57) ABSTRACT

An illumination system includes a radiation source capable of emitting primary radiation and a luminescent material. The luminescent material includes a blend of a first phosphor capable of converting the primary radiation into a broad-band emission in the yellow range of the electromagnetic spectrum, and a second phosphor capable of converting the primary radiation into a multiple narrow-band emission in the red and green range of the electromagnetic spectrum.

20 Claims, 4 Drawing Sheets

FOREIGN PATENT DOCUMENTS

| | | |
|---|---|---|
| WO | 9624156 | 8/1996 |
| WO | 9750132 | 12/1997 |
| WO | 0124284 A1 | 4/2001 |
| WO | 0124285 | 4/2001 |
| WO | 2004084261 A2 | 9/2004 |
| WO | 2005029596 A1 | 3/2005 |

* cited by examiner

ILLUMINATION SYSTEM COMPRISING COLOR DEFICIENCY COMPENSATING LUMINESCENT MATERIAL

FIELD OF THE INVENTION

The invention relates to an illumination system and a luminescent material comprising a phosphor blend for generating specific, colored light, including white light, by means of luminescent down-conversion and additive color mixing based on an ultraviolet or blue radiation-emitting radiation source. A light-emitting diode is especially envisaged as a radiation source. The invention also relates to a luminescent material for use in such an illumination system.

BACKGROUND OF THE INVENTION

Recently, various attempts have been made to provide illumination systems emitting white light by using light-emitting diodes as radiation sources.

A first category of illumination systems emitting white light by using light-emitting diodes is based on the use of multiple visible light-emitting diodes. In these systems, two monochromatic LEDs (e.g. blue and yellow) or three monochromatic LEDs (e.g. red, blue and green) are used in combination. The light from the multiple visible light-emitting diodes is mixed to create a whitish light. However, when generating white light from an arrangement of monochromatic red, green and blue light-emitting diodes, there is such a problem that white light of the desired tone cannot be generated due to lifetime variations of the tone, luminance and other factors of the light-emitting diodes. Complex drive electronics are also necessary to compensate for the differential aging and color shifting of each LED.

In order to overcome these difficulties, illumination systems of a second category have been developed, which convert the color of a light-emitting diode by means of a luminescent material comprising a phosphor to provide visible, preferably white, light illumination.

Such phosphor-converted white light illumination systems are based in particular either on the trichromatic (RGB) approach, i.e. on mixing three colors, namely red, green and blue, in which case the components of the blue output light may be provided by a phosphor and/or by the primary emission of the LED, or in a second, simplified solution, on the dichromatic (BY) approach, mixing yellow and blue colors, in which case the yellow secondary component of the output light may be provided by a yellow phosphor, and the blue component may be provided by a phosphor or by the primary emission of a blue LED. The latter is the most common phosphor-converted system.

In particular, the dichromatic approach as disclosed in e.g. U.S. Pat. No. 5,998,925 uses a blue light-emitting diode of InGaN-based semiconductor material combined with a $Y_3Al_5O_{12}$:Ce (YAG-$Ce^{3+}$) garnet phosphor. The YAG-$Ce^{3+}$ phosphor is coated on the InGaN LED, and a portion of the blue light emitted from the LED is converted to yellow light by the phosphor. Another portion of the blue light from the LED is transmitted through the phosphor. The combination of the yellow and the blue emission creates a convincing perception of whiteness with a typical CRI in the mid-70s and a color temperature Tc that may range from about 6000 K to about 8000 K.

A limitation of such phosphor-converted light-emitting devices stems from a low color rendition.

When illuminated by this type of phosphor-converted LED, an object does not appear natural to the human eye. Colors appear hyper-real or more vivid than under midday sunlight but also appear less differentiated from one another, as the ability of a white light source to accurately reveal colors depends on the number and intensity of the colors contained in the light coming from that source.

The figure of merit for true color rendition is the color-rendering index (CRI). The CRI is a relative scale ranging from 0 to 100, indicating how perceived colors match actual colors. It measures the degree by which perceived colors of objects, illuminated by a given light source, conform to the colors of the same objects when they are lit by a reference standard light source. The higher the color rendering index, the less color shift or distortion occurs.

In the typical solid-state lighting device, which is constituted by the combination of a blue LED and a yellow phosphor, the amount of light emitted therefrom in the red range (not less than 600 nm) and the bluish green range (480 to 510 nm) is notoriously small, and the light emitted from the white LED has a low general color rendering index as well as a low special color rendering index $R_5$ that represents a color rendering property in the bluish green range.

Accordingly, in order to compensate for the deficiency in the red range of the dichromatic spectrum of white light created by these devices, research has been conducted on the control of phosphor characteristics, on the partial replacement of the host and/or activator with another element and on the use of mixed phosphors. FIG. 2 shows emission, excitation, and reflection spectra of the prior-art red-deficiency compensating phosphor YAG:Ce+Pr.

Nevertheless, the addition of red radiation to a blue-yellow spectrum for the purpose of "color correcting" or lowering the CCT (Correlated Color Temperature) of its white light emission often results in light that appears unnaturally pinkish and lowers the color contrast between adjacent objects or in printed images having different colors.

OBJECT AND SUMMARY OF THE INVENTION

Consequently, there is a continued need for an efficient and inexpensive solid-state illumination system that is capable of producing white light with a higher CRI, so that objects illuminated by this illumination system appear more natural to the human eye.

To this end, the present invention provides an illumination system comprising a radiation source capable of emitting primary radiation and a luminescent material comprising a blend of a first phosphor capable of converting the primary radiation into a broad-band emission in the yellow range of the electromagnetic spectrum, and a second phosphor capable of capable of converting the primary radiation into a multiple narrow-band emission in the red and green range of the electromagnetic spectrum.

The phosphors are chosen in order to "fill in" the visible spectrum, i.e. they provide emission at substantially all wavelengths across the visible spectrum so as to produce high color rendering phosphor blends. In addition to the known red-deficiency compensating phosphors, the luminescent material of the invention also compensates the deficiency in the green range of the electromagnetic spectrum. The yellow broad-band emission in combination with emission at discrete red and green spectral lines produces a perceived white light, which has particular desirable color characteristics that differ from those of white light produced by other techniques, as it is well balanced with respect to color. When compared with the spectral distribution of the white output light generated by the prior-art LED, the apparent difference in the spectral distribution is the peak wavelength, which is in the green range of the visible spectrum.

Such illumination systems having a relatively continuous output spectrum in combination with a multi-line output spectrum typically provide a CRI ranging from about 65 to 85.

This characteristic makes the device ideal for applications in which a true color rendition is required. Such applications of the invention include, inter alia, general illumination, traffic lighting, street lighting, security lighting, lighting of automated factories and backlighting of full-spectrum displays.

A light-emitting diode is especially envisaged as a radiation source.

According to a first aspect of the invention, a white light illumination system is provided, which comprises a blue-light emitting diode having a peak emission wavelength in the range of 380 to 490 nm as a radiation source.

Such an illumination system will provide white light in operation. The blue light emitted by the LED excites the phosphor, causing it to emit yellow, green and red light. The blue light emitted by the LED is transmitted through the phosphor blend and is mixed with the green, red and yellow light emitted by the phosphors. The viewer perceives the mixture of blue and yellow, red and green light as white light.

While such illumination systems have a simple design, they achieve both a high efficacy and a high color rendering index with low manufacturing cost and high yield and without substantial color shifting, lifetime, or differential aging problems.

According to one embodiment of the invention, the first yellow-emitting broad-band phosphor is selected from the phosphors comprising an activator ion selected from cerium (III) or cerium(III) together with a second activator ion, preferably selected from the group of europium, praseodymium, samarium, terbium, thulium, dysprosium, holmium and erbium. Typically, the first phosphor is selected from the Ce(III)-activated phosphors comprising a garnet host lattice.

The second green and red-emitting multiple narrow-band phosphor is selected from the phosphors comprising an activator selected from the group of Pr(III) and Pr(III) together with europium and samarium. Typically, the second phosphor is selected from the phosphors comprising a host lattice comprising oxygen and/or fluorine.

Especially preferred are embodiments, wherein the second phosphor is selected from the phosphors comprising a host lattice selected from the garnets defined by the general formula $(Y_{1-x-y}Gd_xLu_y)_3(Al_{1-a}Ga_a)_5O_{12}$ with $0 \leq x \leq 1$, $0 \leq y \leq 1$, $0 \leq a \leq 1$, These phosphors are capable of providing a multiple narrow-band emission spectrum with spectral lines in the cyan-green (480-540 nm) and red (>600 nm) range of the electromagnetic spectrum.

Typically, the weight ratio of the first phosphor to the second phosphor ranges from 95:5 to 75:25

Another aspect of the present invention provides a luminescent material comprising a phosphor blend. The phosphor blend comprises at least two phosphors each selected from one of the groups of phosphors that absorb blue and/or near-UV electromagnetic radiation and emit in a range of visible light.

A first component of the blend comprises a first phosphor capable of a broad-band emission in the yellow range of the electromagnetic spectrum and a second component comprising a second phosphor capable of a multiple narrow-band emission in the red and green range of the electromagnetic spectrum.

These specific phosphor blends are especially valuable in white light-emitting phosphor-converted LEDs with low color temperature and improved color rendering.

DETAILED DESCRIPTION OF THE INVENTION

The invention relates to an illumination system comprising a radiation source capable of emitting primary radiation and a luminescent material comprising a blend of a first component comprising a first phosphor capable of converting the primary radiation into a broad-band emission in the yellow range of the electromagnetic spectrum and a second component comprising a second phosphor capable of converting the primary radiation into a multiple narrow-band emission in the red and green range of the electromagnetic spectrum.

Radiation sources include semiconductor optical radiation emitters and other devices that emit optical radiation in response to electrical excitation. Semiconductor optical radiation emitters include light-emitting diode LED chips, light-emitting polymers (LEPs), organic light-emitting devices (OLEDs), polymer light-emitting devices (PLEDs), etc.

Moreover, light-emitting components such as those found in discharge lamps and fluorescent lamps, such as low and high-pressure mercury discharge lamps, sulfur discharge lamps, and discharge lamps based on molecular radiators are also envisaged for use as radiation sources with the present inventive phosphor compositions.

The term "radiation" as used herein encompasses preferably radiation in the UV and visible ranges ("light") of the electromagnetic spectrum.

While the use of the present invention is envisaged for a wide array of illumination systems, the invention is described with particular reference to and finds particular application in light-emitting diodes, especially UV and blue light-emitting diodes.

Any configuration of an illumination system which includes a light-emitting diode and a luminescent material comprising a blend of a first component comprising a first phosphor capable of a broad-band emission in the yellow range of the electromagnetic spectrum and a second component comprising a second phosphor capable of a multiple narrow-band emission in the red and green range of the electromagnetic spectrum is envisaged in the present invention, preferably with the addition of other well-known phosphors which can be combined to achieve a specific color or white light when irradiated by a LED emitting primary violet to blue light as specified above.

A detailed construction of one embodiment of such an illumination system comprising a radiation source and a luminescent material shown in FIG. 1 will now be described.

FIG. 1 is a schematic view of a chip-type light-emitting diode with a coating comprising the luminescent material. The device comprises a chip-type light-emitting diode (LED) 1 as a radiation source. The diode chip 1 is positioned in a reflector cup lead frame 2. The chip 1 is connected to a first terminal 6 via a bond wire 7 and directly to a second electric terminal 6. The recess of the reflector cup is filled with a coating material that contains a luminescent material according to the invention to form a coating layer embedded in the reflector cup. The phosphors 3, 4 of the luminescent material are applied either in separate layers or in a mixture. Typically the luminescent material comprises a resin binder 5.

In operation, electric power is supplied to the chip to activate the chip. When activated, the chip emits the primary light, e.g. blue light. A portion of the emitted primary light is completely or partially absorbed by the luminescent material in the coating layer. The luminescent material then emits secondary light, i.e. the converted light having a longer peak wavelength: yellow in a sufficiently broad-band emission (specifically with a significant proportion of red) together with a multiple red and green narrow-band emission in response to absorption of the primary light. The remaining unabsorbed portion of the emitted primary blue light is transmitted through the luminescent layer, along with the secondary light. The encapsulation directs the unabsorbed primary light and the secondary light in a general direction as output light. Thus, the output light is a composite polychromatic light, which is composed of the primary light emitted from the die and the secondary light emitted from the luminescent material comprising a phosphor blend.

The color temperature or color point of the output light of an illumination system according to the invention will vary in dependence upon the spectral distributions and intensities of the secondary light in comparison with the primary light.

First, the color temperature or color point of the primary light can be varied by suitable choice of the light-emitting diode.

Secondly, the relative contributions of primary and secondary emission bands can be modified to optimize the luminous efficiency of the LED and the color characteristics of the total emission. These adjustments can be accomplished by changing the thickness of the phosphor-containing resin surrounding the die, or by varying the concentration of the phosphors suspended in the resin.

Thirdly, the color temperature or color point of the secondary light can be varied by suitable choice of the phosphor blend in the luminescent material, its particle size and its concentration. Furthermore, these arrangements also advantageously provide the possibility of using different phosphor blends in the luminescent material, as a result of which, advantageously, the desired hue can be set even more accurately.

According to a preferred aspect of the invention, the output light of the illumination system may have a spectral distribution such that it appears to be "white" light.

In a first embodiment of the invention, a white light-emitting illumination system was advantageously produced by choosing the luminescent material such that a blue radiation emitted by a blue light-emitting diode is converted into complementary wavelength ranges, to form polychromatic white light.

Particularly good results are achieved with a blue LED whose emission maximum is at 380 to 490 nm. An optimum has been found to be at 445 to 468 nm, taking particular account of the excitation spectrum of cerium(III)-activated and praseodymium(III)-activated phosphors.

As an alternative to the blue-emitting LED, an UV-emitting LED in combination with an additional blue-emitting phosphor may be used.

The luminescent material according to the invention comprises a phosphor blend of a first component and a second component.

When excited by the violet to blue radiations generated by the radiation source, a first component of the phosphor blend exhibits an emission spectrum centered generally in the green to yellow range of the visible spectrum. A second component of the blend exhibits multiple lines or a very narrow-band emission located primarily in the deep red and in the cyan-green range of the visible spectrum.

The relative proportions of the foregoing phosphor components are selected in such a way that white light of predetermined ICI coordinates is produced when their emissions are blended with the visible emission, if any, generated by the discharge, and because of the selected spectrum of radiations which are generated, the color rendition of objects illuminated thereby is excellent.

Suitable general broad-band yellow-green emitting phosphors include those having an emission band with a maximum between 550 nm and 590 nm, more preferably between 570 nm and 580 nm, and having a half-value width of between 50 nm and 150 nm, more preferably 90 nm and 120 nm.

Typically, the green to yellow broad-band emitting phosphors that are used include the yttrium-aluminum garnet series of phosphors: $(Y_m A_{1-m})_3 (Al_n B_{1-n})_5 O_{12}$, doped with Ce; where $0 \leq m \leq 1$, $0 \leq n \leq 1$; A includes rare earth elements, cerium, praseodymium, neodymium, samarium, gadolinium, dysprosium, holmium, erbium, thulium, ytterbium, and lutetium; B includes boron, gallium, indium, and combinations thereof The phosphor material that has been most commonly used is YAG:Ce, because it absorbs light provided by blue LEDs and converts it to a fairly broad but mostly yellow emission. The YAG:Ce phosphor includes a host material composed of an yttrium and aluminum composite oxide $(Y_3 Al_5 O_{12})$, and cerium (Ce) incorporated as a luminescent center ion therein.

Also useful as a first yellow emitting broad-band phosphor is a phosphor defined by the general formula $(Y_{1-x-y} Gd_x Lu_y)_3 Al_5 O_{12} Ce_z$, wherein $0 \leq x \leq 1$; $0 \leq y \leq 1$ and $0.001 < z < 0.02$.

These phosphors also emit light of a broad spectrum having a peak in the range of 545 to 580 nm.

Moreover, efficiency of excited light emission in a wavelength range of 460 nm and more can be increased by including gadolinium Gd in the crystal of the phosphor of the second embodiment. When the Gd content is increased, the emission peak wavelength is shifted towards a longer wavelength and the entire emission spectrum is shifted towards longer wavelengths. This means that, if required, emission of more reddish light can be achieved by increasing the degree of substitution with Gd. When the Gd content is increased, the luminance of light emitted by photoluminescence under blue light tends to decrease.

In combination with a red and green compensating second phosphor, it may be desirable to substitute part of the aluminum for gallium so as to shift the wavelength of the emitted light to a shorter wavelength.

Suitable multiple narrow-band red-emitting phosphors emitting in the red and green range of the electromagnetic spectrum include those having at least one emission band with a maximum between 620 nm and 660 nm and a peak width at half a maximum of between 1 nm and 30 nm, more preferably 5 nm and 25 nm, also having at least one emission band with a maximum between 480 nm and 540 nm and a peak width at half a maximum of between 1 nm and 30 nm, more preferably 5 nm and 25 nm.

Preferably, the second phosphor is a phosphor activated by praseodymium(III), or by praseodymium(III) in combination with samarium(III) and/or europium(III).

Activation by Pr(III) is preferred, because Pr(III) has a relatively intense absorption band between 450 and 490 nm due to rather intense $^3H_4$-$^3P_J$ and $^3H_4$-$^1I_6$ transitions.

Host lattices that provide a high charge density between the Pr(III) ions and the surrounding ligands are preferred because of their higher covalency. Higher covalency leads to increased mixing with opposite parity term states within the Pr(III) level manifold and thus to higher oscillator strengths of the absorption lines and faster decaying emission transitions.

Lattices, which fulfill this requirement must be relatively covalent and preferably comprise oxygen and/or fluorine ligand ions. Such lattices are e.g. $La_2 Ti_2 O_7$, $(Y_{1-x} Gd_x)VO_4$, with $0 \leq x \leq 1$; $CaTiO_3$, $(Sr,Ca)(Zr,Al)O_3$ $(Y_{1-x-y} Gd_x Lu_y)_2 O_3$, with $0 \leq x \leq 1$, $0 \leq y \leq 1$, $(Sr_{1-x}Ca_x)_2SiO_4$ with $0 \leq x \leq 1$ and cubic garnet $(Y_{1-x-y}Gd_xLu_y)_3(Al_{1-a}Ga_a)_5O_{12}$ with $0 \leq x \leq 1$, $0 \leq y \leq 1$, $0 \leq a \leq 1$, Suitable cubic garnet host materials for the present invention include, for example, yttrium-aluminum garnet $Y_3Al_5O_{12}$, yttrium-gadolinium-aluminum garnet $((Y,Gd)_3Al_5O_{12})$, gadolinium aluminum garnet, gadolinium gallium garnet $(Gd_3 Ga_5O_{12})$, gadolinium scandium gallium garnet $(Gd_3Sc_2Ga_3O_{12})$, gadolinium scandium aluminum garnet $(Gd_3 Sc_2 Al_3O_{12})$, lutetium aluminum garnet $(Lu_3 Al_5O_{12})$, and yttrium gallium garnet $(Y_3Ga_5O_{12})$. In the above examples, the B site (i.e. in the generic formula $A_3B_5 O_{12}$) may be occupied by two elements. In other garnets, the A site may be occupied by two elements.

The doping of these lattices by 0.01 to 10% $Pr^{3+}$, preferably 0.1 to 1.0% $Pr^{3+}$, results in phosphors having strong multiple narrow emission lines in the red and green range of the emission spectrum, see FIGS. 4 to 7.

In addition to praseodymium as the luminescence activator, other elements may be included in the host material. For example, ytterbium, samarium, and europium may be added as co-activators.

FIG. 5 shows the excitation, emission and reflection spectra of $Y_3Al_5O_{12}$:1% Pr, and FIG. 6 shows the excitation, emission and reflection spectra of $(Y,Gd)Al_5O_{12}$:1% Pr. FIG. 7 shows the emission spectrum of $Gd_3Al_5O_{12}$:1% Pr.

These first and second phosphors are compatible with each other and may be prepared, blended and applied as a phosphor coating or monolithic ceramic color converter using techniques that are well known in the art.

Though the specific amounts of the phosphors used will depend upon the color temperature, full spectrum phosphor blends of the invention are preferably two-phosphor blends of the following materials combined in the following proportions:

(1) about 70 to 95%, preferably 75 to 85%, of a first phosphor capable of a broad-band emission in the yellow range of the electromagnetic spectrum (the amount increasing with a decreasing CCT).

(2) about 5 to 30%, preferably 15 to 25%, of a second phosphor capable of a multiple narrow-band emission in the red and green range of the electromagnetic spectrum, wherein the percentages are based on the total weight of the phosphor blend, and the combined percentages amount to a total of 100%.

The color rendering of the lamp can be further improved by an additional red-emitting phosphor component, the maximum emission of which is at a wavelength of 630±15 nm, and the full width at a half maximum of which is greater than 50 nm.

For comparison with the prior art, FIG. 3 shows the emission, excitation and reflection spectra of a red-deficiency compensating Ce(III)-activated garnet comprising an additional doping of Pr(III).

Specific Embodiments

1. White LED Comprising YAG:2% Ce and YAG:1% Pr

A phosphor blend of 70 to 80% YAG:2% Ce and 20 to 30% YAG: 1% Pr was suspended in a silicone precursor, a polymerization catalyst was added, and a droplet of this suspension was deposited onto the LED die, based on a 460 nm emitting InGaN. A plastic cap sealed the LED and the silicone was polymerized within about an hour. The spectra of LEDs with three different coating thicknesses are depicted in FIG. 3.

2. White LED Comprising (Y,Gd)AG:2% Ce and (Y,Gd)AG:1% Pr

A phosphor blend of 70 to 80% (Y,Gd)AG:2% Ce and 20 to 30% (Y,Gd)AG:1% Pr was suspended in a silicone precursor, a polymerization catalyst was added, and a droplet of this suspension was deposited onto the LED die, based on a 460 nm emitting InGaN. A plastic cap sealed the LED and the silicone was polymerized within about an hour. The spectra of LEDs with two different coating thicknesses are depicted in FIG. 4.

According to a further aspect of the invention, in addition to white light, light of other colors may be generated from other blends of phosphors that comprise phosphor blends selected from the groups disclosed above with appropriate proportions.

While preferred embodiments of the invention have been shown and described, various other embodiments and modifications falling within the scope of the invention as defined by the appended claims will be apparent to those skilled in the art.

Figure 1:
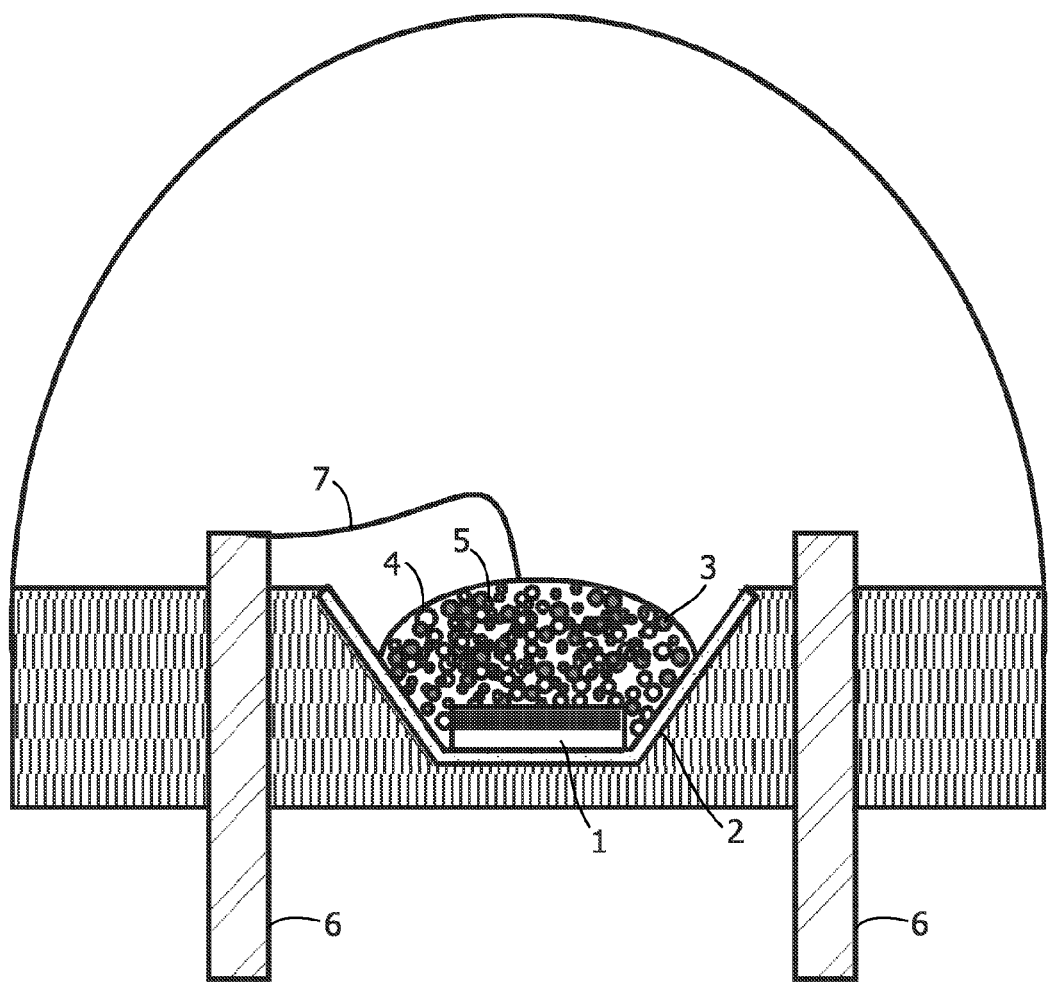
FIG. 1 is a schematic view of a dichromatic white LED lamp comprising a phosphor of the present invention positioned in a pathway of light emitted by a LED structure.
Figure 2:
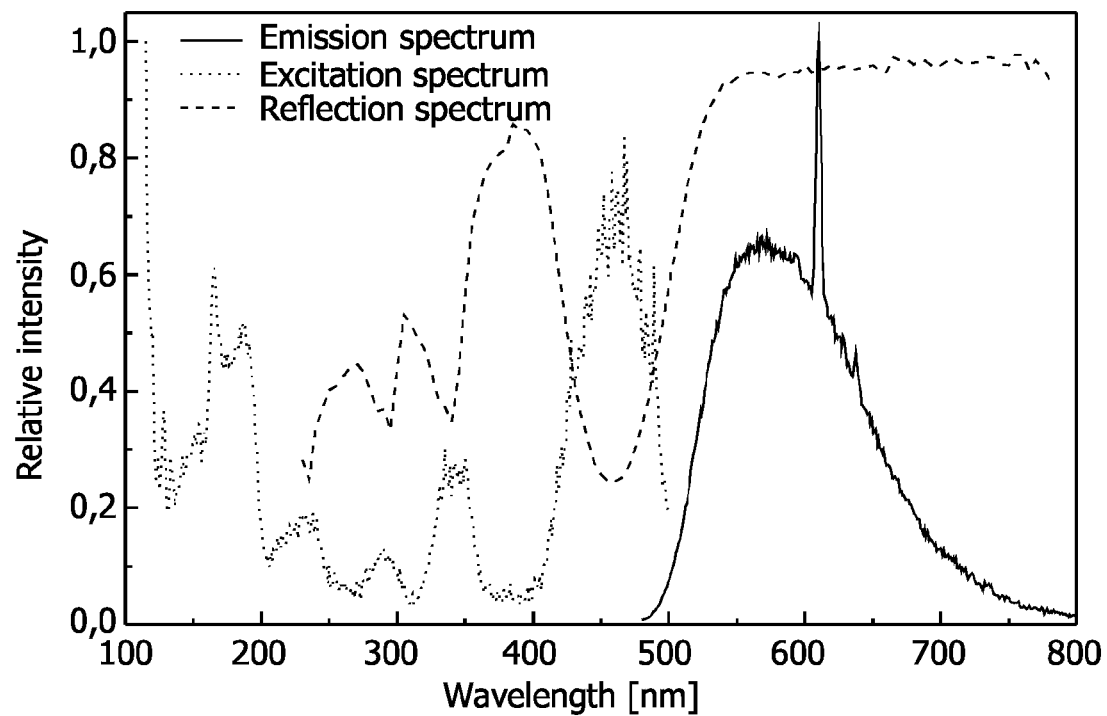
FIG. 2 shows emission, excitation, and reflection spectra of prior-art red-deficiency compensating YAG:Ce+Pr.
Figure 3:
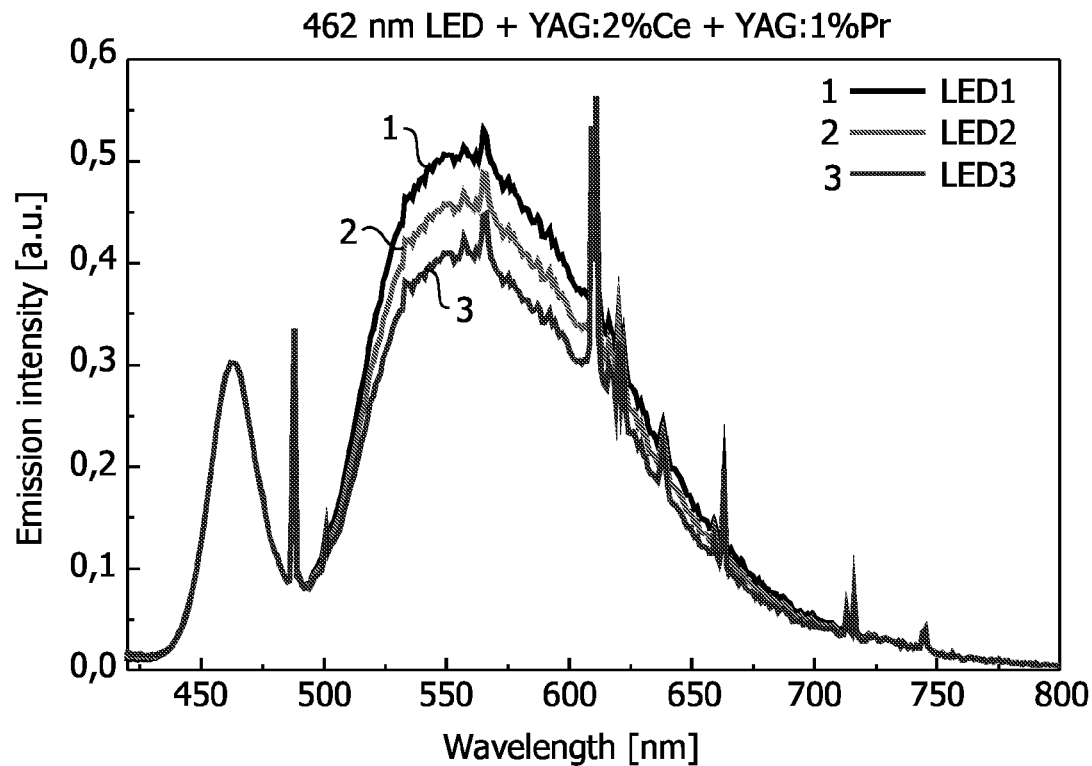
FIG. 3 shows the emission spectrum of a white LED based on a 460 nm emitting InGaN semiconductor coated by a blend of YAG:2% Ce and YAG:1% Pr.
Figure 4:
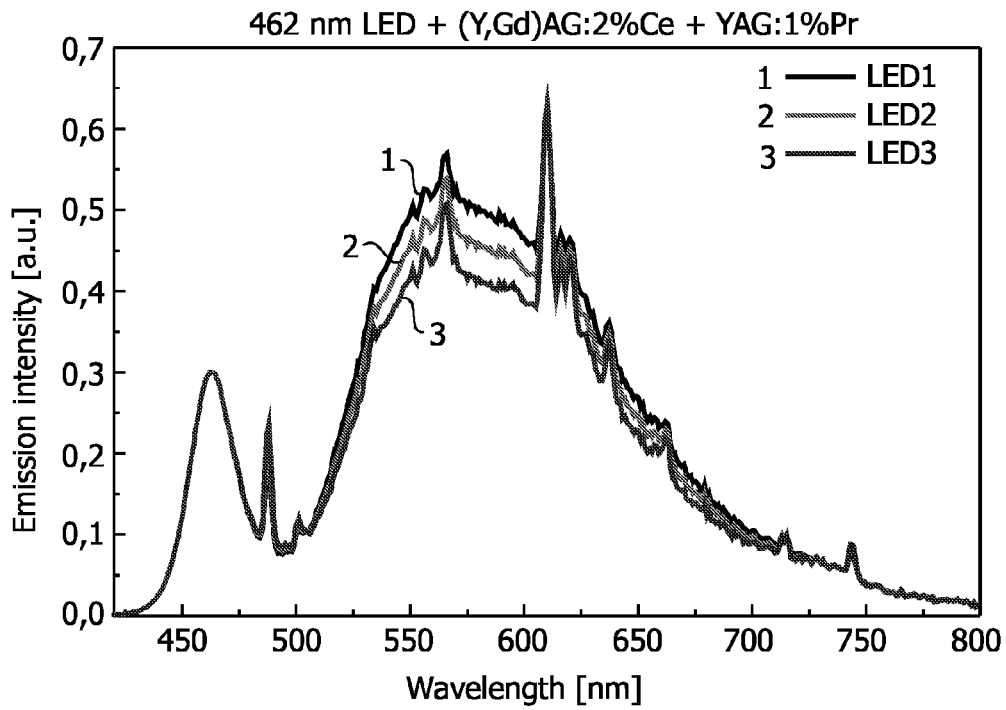
FIG. 4 shows the emission spectrum of a white LED based on a 460 nm emitting InGaN semiconductor coated by a blend of (Y,Gd)AG:2% Ce and (Y,Gd)AG:1% Pr.
Figure 5:
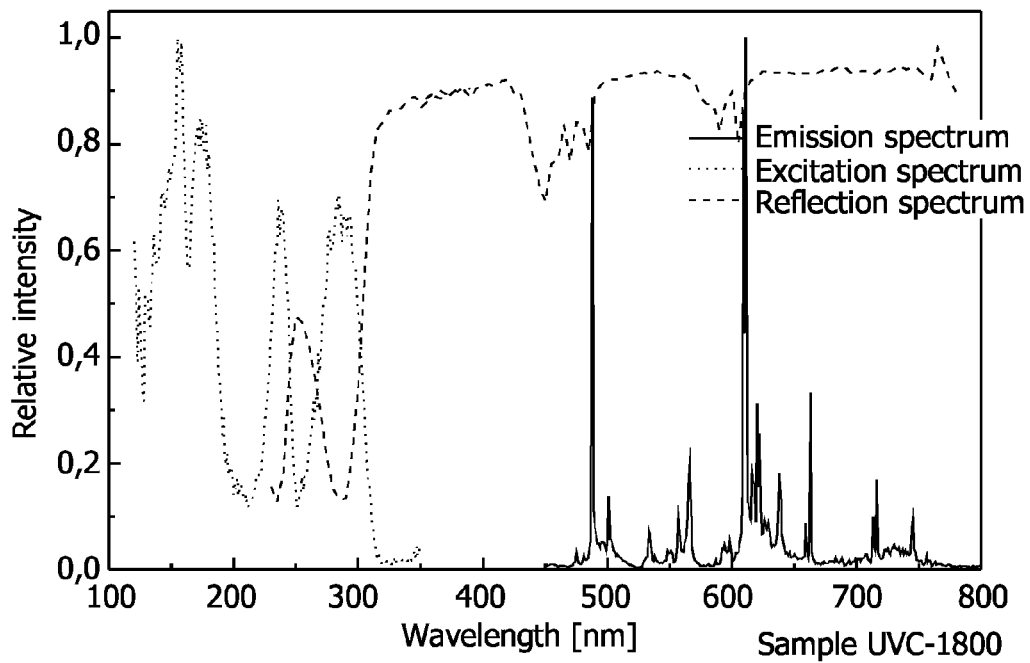
FIG. 5 shows the emission, excitation, and reflection spectra of $Y_3Al_5O_{12}$:1% Pr.
Figure 6:
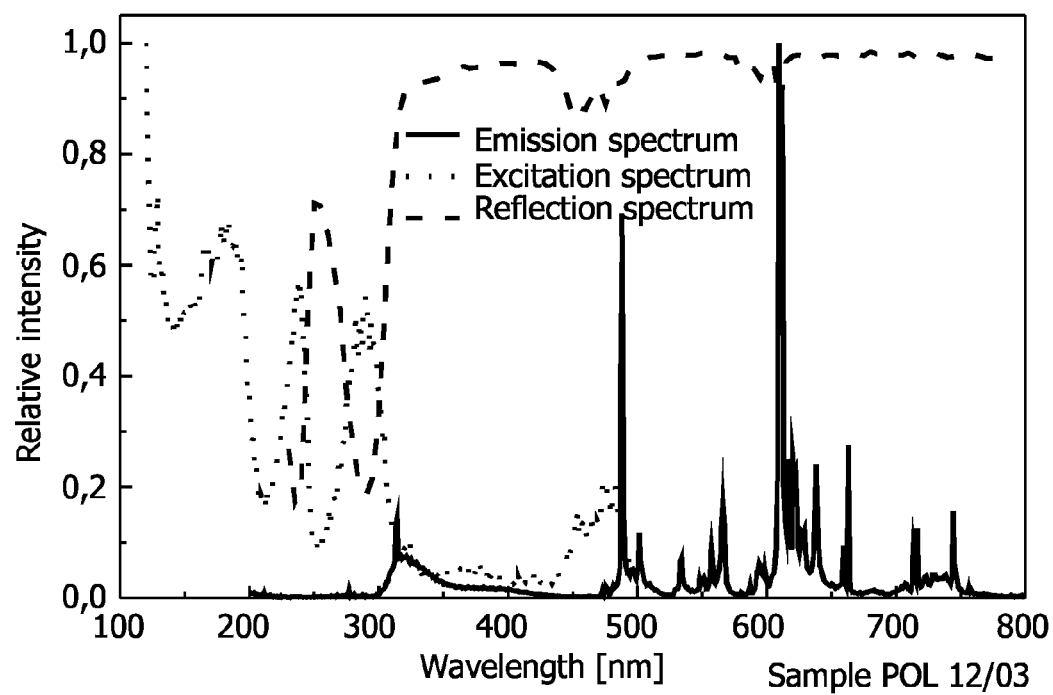
FIG. 6 shows the excitation, emission, and reflection spectra of $(Y,Gd)Al_5O_{12}$:1% Pr.
Figure 7:
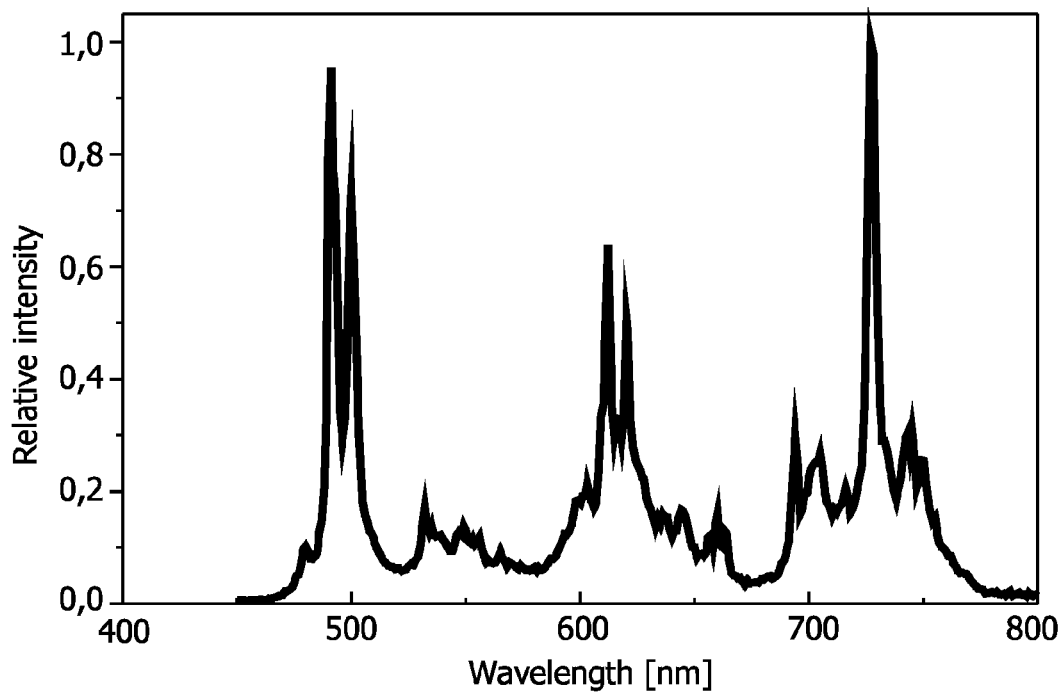
FIG. 7 shows the emission spectrum of $Gd_3Al_5O_{12}$:1% Pr.

The invention claimed is:

1. An illumination system comprising a radiation source capable of emitting primary radiation and a luminescent material comprising a blend of a first phosphor capable of converting the primary radiation into a broad-band emission in the yellow range of the electromagnetic spectrum and a second phosphor capable of converting the primary radiation into a multiple narrow-band emission in the red and green range of the electromagnetic spectrum, wherein a broad peak width at half a maximum peak value of the broad-band emission is at least 50% more than a narrow peak width at half a maximum peak value of the multiple narrow-band emission.

2. The illumination system according to claim 1, wherein the radiation source is capable of emitting primary radiation with a peak emission wavelength in the range of 380 to 490 nm.

3. The illumination system according to claim 1, wherein the radiation source is a light-emitting diode.

4. The illumination system according to claim 1, wherein the first phosphor is selected from the phosphors comprising an activator ion selected from the group of Ce(III) and Ce(III) together with a second activator ion.

5. The illumination system according to claim 4, wherein the first phosphor is selected from the Ce(III)-activated phosphors comprising a garnet host lattice.

6. The illumination system according to claim 1, wherein the second phosphor is selected from the phosphors comprising an activator selected from the group of Pr(III) and Pr(III) together with a second activator ion.

7. The illumination system according to claim 6, wherein the second phosphor is selected from the praseodymium(III)-activated phosphors comprising a host lattice comprising at least one of oxygen and fluorine.

8. The illumination system according to claim 6, wherein the second phosphor is selected from the phosphors comprising a host lattice selected from garnets defined by a general formula of $(Y_{1-x-y}Gd_xLu_y)_3(Al_{1-a}Ga_a)_5O_{12}$ with $0 \leq x \leq 1$, $0 \leq y \leq 1$, $0 \leq a \leq 1$.

9. The illumination system according to claim 6, wherein a weight ratio of the first phosphor to the second phosphor ranges from 95:5 to 75:25.

10. A luminescent material comprising a blend of a first component comprising a first phosphor capable of a broadband emission in the yellow range of the electromagnetic spectrum and a second component comprising a second phosphor capable of a multiple narrow-band emission in the red and green range of the electromagnetic spectrum, wherein a broad peak width at half a maximum peak value of the broadband emission is at least 50% more than a narrow peak width at half a maximum peak value of the multiple narrow-band emission.

11. The illumination system of claim 1, wherein the broad peak width is between 50 nm and 150 nm, and the narrow peak width is between 1 nm and 30 nm.

12. The illumination system of claim 1, wherein the broad peak width is between 90 nm and 120 nm, and the narrow peak width is between 5 nm and 25 nm.

13. The illumination system of claim 1, wherein a light output of the illumination system has a color-rendering index of 65 to 85.

14. The illumination system of claim 1, wherein the first phosphor comprises $(Y_mA_{1-m})_3(Al_nB_{1-n})_5O_{12}$, doped with Ce; where $0 \leq m \leq 1$, $0 \leq n \leq 1$; A includes rare earth elements, cerium, praseodymium, neodymium, samarium, gadolinium, dysprosium, holmium, erbium, thulium, ytterbium, and lutetium; and B includes boron, gallium, indium, and combinations thereof.

15. The illumination system of claim 1, wherein the first phosphor comprises $(Y_{1-x-y}Gd_xLu_y)_3Al_5O_{12}Ce_z$, where $0 \leq x \leq 1$; $0 \leq y \leq 1$ and $0.001 < z < 0.02$.

16. The illumination system of claim 1, wherein the second multiple narrow-band phosphor is selected from the praseodymium(III)-activated phosphors comprising a host lattice comprising at least one of $La_2Ti_2O_7$, $(Y_{1-x}Gd_x)VO_4$, where $0 \leq x \leq 1$; $CaTiO_3$, $(Sr,Ca)(Zr,Al)O_3$ $(Y_{1-x-y}Gd_xLu_y)_2O_3$, where $0 \leq x \leq 1$; $0 \leq y \leq 1$; $(Sr_{1-x}Ca_x)_2SiO_4$ where $0 \leq x \leq 1$; and cubic garnet $(Y_{1-x-y}Gd_xLu_y)_3(Al_{1-a}Ga_a)_5O_{12}$ where $0 \leq x \leq 1$, $0 \leq y \leq 1$, $0 \leq a \leq 1$.

17. The illumination system of claim 1, wherein the blend comprises the first phosphor in an amount of substantially 70% to 95% and the second phosphor in an amount of substantially 5% to 30%.

18. The illumination system of claim 1, wherein the blend comprises the first phosphor in an amount of substantially 75% to 85% and the second phosphor in an amount of substantially 15% to 25%.

19. The luminescent material of claim 10, wherein the broad peak width is between 50 nm and 150 nm, and the narrow peak width is between 1 nm and 30 nm.

20. The luminescent material of claim 10, wherein the broad peak width is between 90 nm and 120 nm, and the narrow peak width is between 5 nm and 25 nm.

* * * * *